US010727099B2

(12) United States Patent
Mimura et al.

(10) Patent No.: US 10,727,099 B2
(45) Date of Patent: Jul. 28, 2020

(54) SUBSTRATE STORAGE CONTAINER

(71) Applicant: Shin-Etsu Polymer Co., Ltd., Tokyo (JP)

(72) Inventors: Hiroshi Mimura, Saitama (JP); Junya Toda, Saitama (JP)

(73) Assignee: Shin-Etsu Polymer Co., Ltd., Tokyo (JP)

( * ) Notice: Subject to any disclaimer, the term of this patent is extended or adjusted under 35 U.S.C. 154(b) by 0 days.

(21) Appl. No.: 16/324,712

(22) PCT Filed: Jul. 20, 2017

(86) PCT No.: PCT/JP2017/026201
§ 371 (c)(1),
(2) Date: Feb. 11, 2019

(87) PCT Pub. No.: WO2018/034101
PCT Pub. Date: Feb. 22, 2018

(65) Prior Publication Data
US 2019/0189489 A1 Jun. 20, 2019

(30) Foreign Application Priority Data

Aug. 19, 2016 (JP) ................... 2016-161086

(51) Int. Cl.
*H01L 21/677* (2006.01)
*H01L 21/673* (2006.01)
*H01L 21/687* (2006.01)

(52) U.S. Cl.
CPC ...... *H01L 21/67769* (2013.01); *H01L 21/673* (2013.01); *H01L 21/67373* (2013.01);
(Continued)

(58) Field of Classification Search
CPC ......... H01L 21/67769; H01L 21/67766; H01L 21/67772; H01L 21/67383;
(Continued)

(56) References Cited

U.S. PATENT DOCUMENTS 8,770,410 B2 * 7/2014 Ogawa .............. H01L 21/67379
206/454
2012/0325707 A1 12/2012 Ogawa
(Continued)

FOREIGN PATENT DOCUMENTS

EP 1434256 A2 * 6/2004 ....... H01L 21/67373
JP 200834879 A 2/2008
(Continued)

*Primary Examiner* — Rafael A Ortiz
(74) *Attorney, Agent, or Firm* — The Webb Law Firm

(57) ABSTRACT

A substrate storage container with increased mounting force of the conveyance component is provided. The substrate storage container comprises a container body having an opening closed by a lid and capable of storing a plurality of substrates, and a conveyance component detachably attached to the container body via a mounting mechanism, wherein the mounting mechanism includes at least one first mounting portion on the opening side of the container body and at least one second mounting portion on the side away from the opening. Furthermore, the conveyance component has at least one engaging portion to be engaged with the mounting mechanism, and the at least one engaging portion includes at least one first engaging portions displaced and engaged in a predetermined direction and at least one second engaging portion displaced and engaged in a direction different from the predetermined direction.

14 Claims, 6 Drawing Sheets

(52) U.S. Cl.
CPC .. *H01L 21/67383* (2013.01); *H01L 21/67386* (2013.01); *H01L 21/67766* (2013.01); *H01L 21/67772* (2013.01); *H01L 21/68785* (2013.01)

(58) Field of Classification Search
CPC ............. H01L 21/68785; H01L 21/673; H01L 21/67373; H01L 21/67386
USPC ......................................... 206/710, 711, 712
See application file for complete search history.

(56) References Cited

U.S. PATENT DOCUMENTS

2013/0270152 A1* 10/2013 Gregerson ........ H01L 21/67379
  206/710
2016/0104649 A1   4/2016 Kanamori

FOREIGN PATENT DOCUMENTS

| | | |
|---|---|---|
| JP | 2011129660 A | 6/2011 |
| JP | 2011181867 A | 9/2011 |
| JP | 2013546176 A | 12/2013 |
| WO | 2014192109 A1 | 12/2014 |

\* cited by examiner

SUBSTRATE STORAGE CONTAINER

CROSS-REFERENCE TO RELATED APPLICATIONS

This application is the United States national phase of International Application No. PCT/JP2017/026201 filed Jul. 20, 2017, and claims priority to Japanese Patent Application No. 2016-161086 filed Aug. 19, 2016, the disclosure of each of which is hereby incorporated by reference in its entirety.

BACKGROUND OF THE INVENTION

Technical Field

The present invention relates to a substrate storage container for storing a plurality of substrates.

Background Art

A substrate such as a semiconductor wafer, while being housed in the internal space of a substrate storage container is able to be stored in warehouses, transported between semiconductor processing machines, and transported between factories. In these substrate storage containers, conveyance components are attached to the ceiling surface of the container body so that they can be handled by an automatic transfer device such as an overhead traveling device or a robot (see Patent Documents 1 and 2).

For example, Patent Document 1 discloses a substrate storage container which is detachably mounted with a mounting mechanism which is provided on the ceiling surface of the container body and has a bifurcated portion formed by combining a guide piece and an interference engaging portion, and with an elastic engagement piece provided on a conveyance component used for transporting and engaged with the bifurcated portion of the mounting mechanism.

PRIOR ART DOCUMENTS

Patent Documents

[Patent Document 1] Japanese Unexamined Patent Application 2011-181867
[Patent Document 2] Japanese Unexamined Patent Application 2008-034879

DISCLOSURE OF INVENTION

Summary of the Invention

However, in the structure described in Patent Document 1 the substrate container is immovably locked in only one direction in either the left-right direction or the front-rear direction, and due to this, the conveyance component may become detached from the container body due to some impact caused by a sudden stop or sudden movement during conveyance of the substrate storage container. Also, even when handled by an operator, preventing the conveying component from being easily detached from the container body is desirable.

Accordingly the present invention has been made in view of the above problem, and an object of the present invention is to provide a substrate storage container with increased mounting force of the conveyance component.

(1) According to embodiments of the present invention, a substrate container comprises a container body which has an opening closed by a lid and is capable of storing a plurality of substrates, and a conveyance component detachably attached to the container body, wherein a mounting mechanism includes at least one first mounting portion on the opening side of the container body and at least one second mounting portion on the side away from the opening.

(2) According to some embodiments, the mounting mechanism may be provided on a peripheral wall of the container body and may include at least one stopper for engaging and locking the conveyance component.

(3) According to some embodiments, the conveyance component has engaging portions to be engaged with the mounting mechanism, and the engaged portions may include at least one first engaging portion that is displaced in a predetermined direction and engages with the at least one first mounting portion and at least one second engaging portion displaced in a direction different from the predetermined direction to engage with the at least one second mounting portion.

The embodiments of the present invention are able to provide a substrate storage container in which the mounting force of the conveyance component is increased.

DESCRIPTION THE INVENTION

Figure 1:
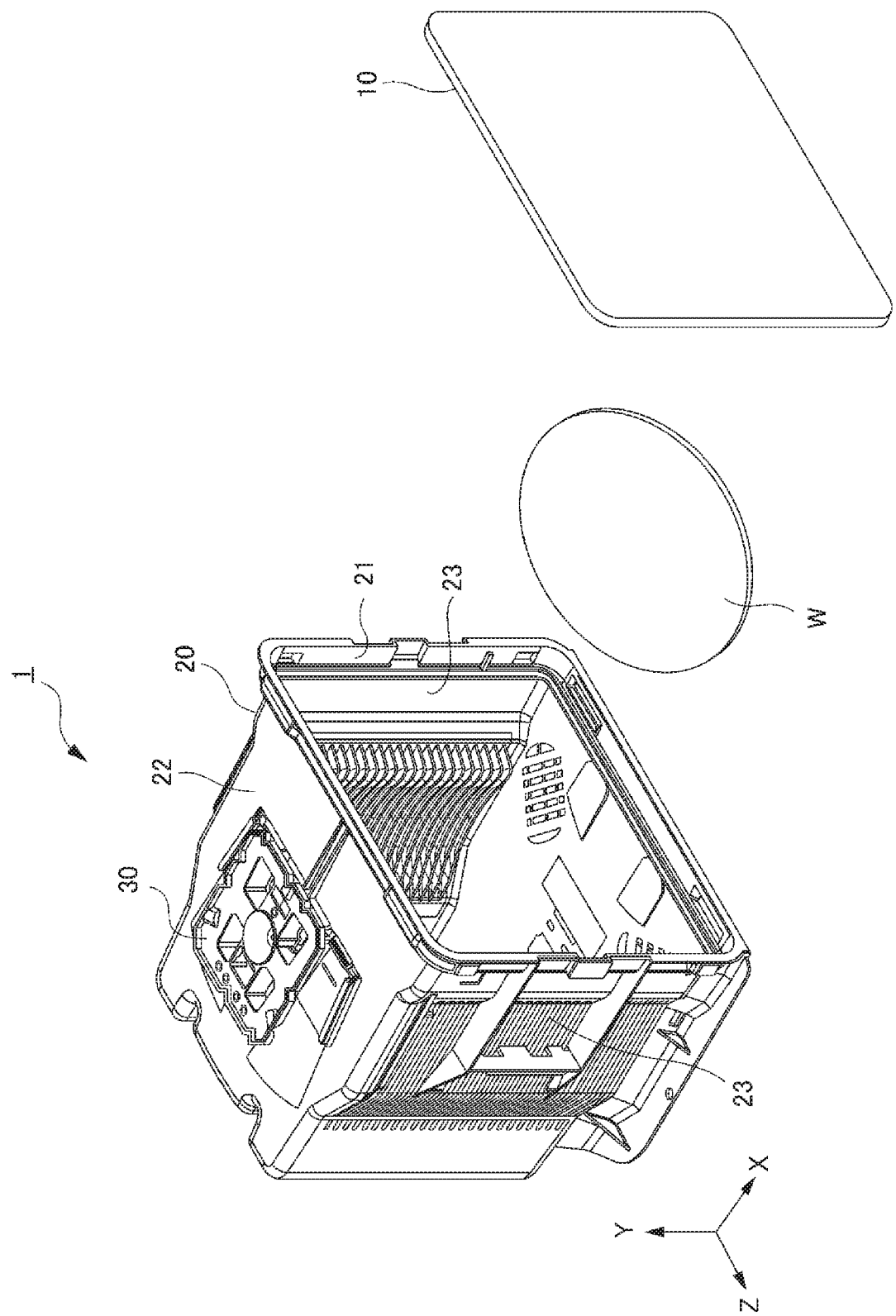
FIG. 1 is an exploded perspective view showing a substrate storage container according to an embodiment of the present invention.

Hereinafter, embodiments of the present invention will be described in detail with reference to the drawings. In the embodiments of the present specification, the same reference numerals are given to the same members throughout. Front F and Back B are indicated by outlined arrows in the figure as necessary. In the figure, the front F and the back B are the X axis direction, the vertical direction is the Y axis direction, and the horizontal direction orthogonal to the X axis direction and the Y axis direction is the Z axis direction.

Figure 2:
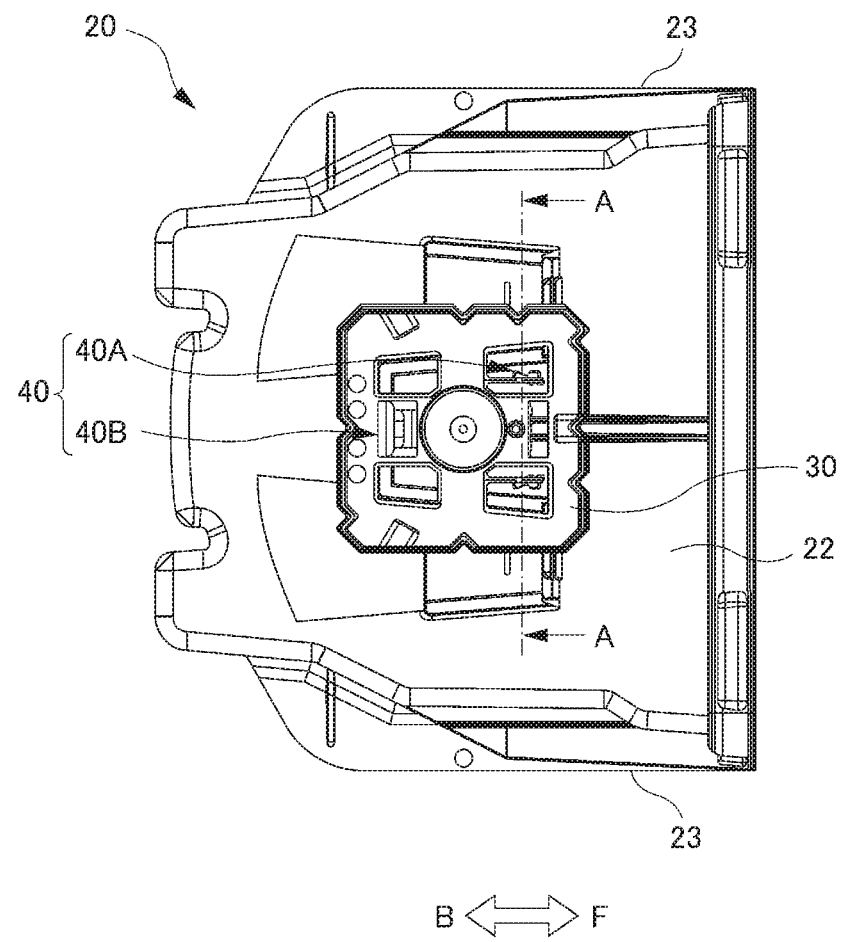
FIG. 2 is a plan view showing a container body.

The substrate storage container will be described. FIG. 1 is an exploded perspective view of a substrate storage container according to an embodiment of the present invention. FIG. 2 is a plan view showing the container body.

The substrate storage container 1 shown in FIG. 1 includes a lid 10 and a container body 20 for storing a plurality of substrates W. Some examples of the substrates W stored in the substrate storage container 1 include a semiconductor wafer having a diameter of 300 mm or 450 mm, a glass mask, or the like.

The container body 20 is known as a front opening box type formed by a front opening frame which forms the opening 21, a rear, left and right side walls 23, a ceiling surface 22, and a bottom surface. The opening 21 of the container body 20 is closed by the lid 10. On the ceiling surface 22 of the container body 20, a conveyance component 30, to be described later, is detachably attached (see also FIG. 2).

The lid 10 and the container body 20 are formed by injection molding each of a plurality of parts with a molding material containing a predetermined resin and assembling the plurality of parts. Examples of the predetermined resin in the molding material include polycarbonate, polyether ether ketone, polyether imide, polybutylene terephthalate, polyacetal, liquid crystal polymer, cyclic olefin resin, and the like which have excellent mechanical properties and heat resistance. In addition, carbon, metal fibers, conductive polymers, antistatic agents, flame retardants, and the like may be selectively added to these resins as necessary.

Figure 3:
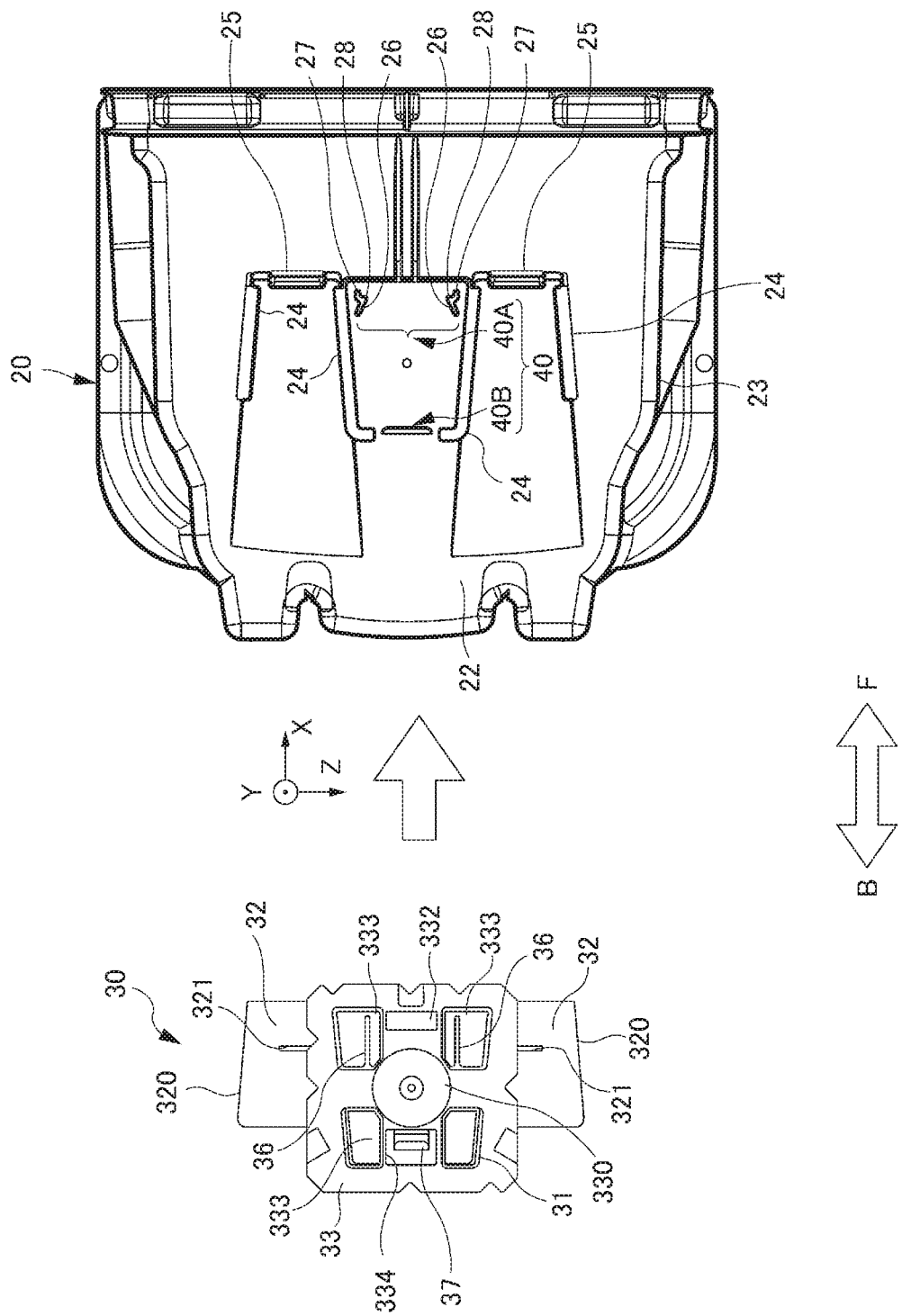
FIG. 3 is a plan view showing a state in which a conveyance component is separated from a container body.
Figure 4:
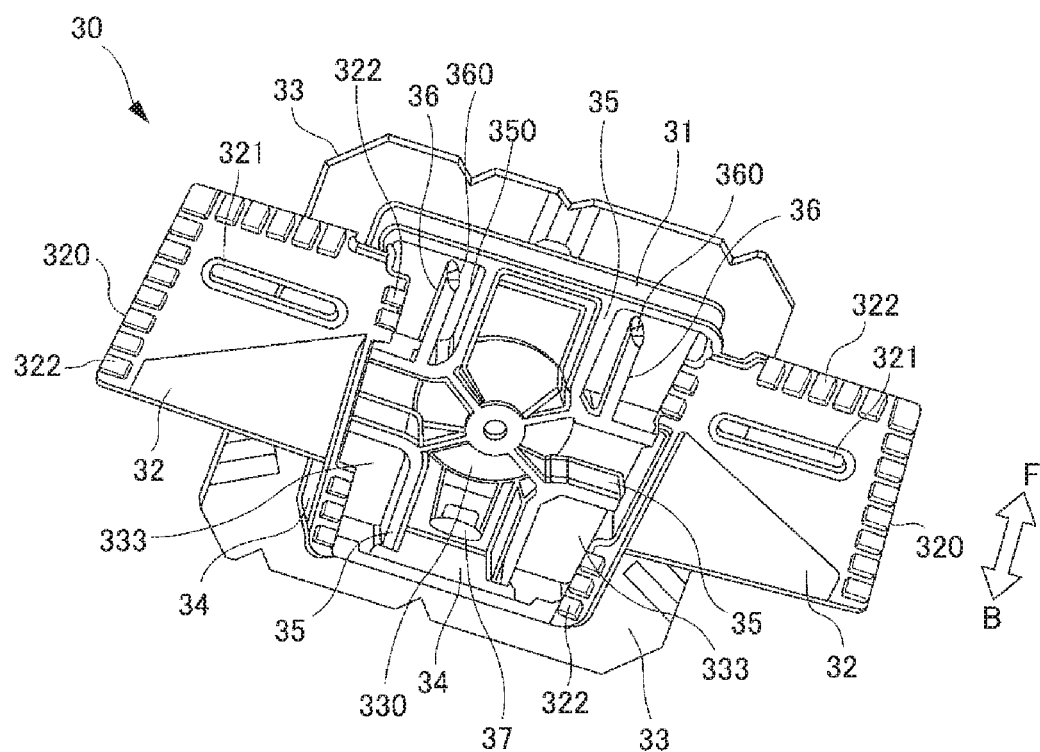
FIG. 4 is a perspective view from a back side showing a conveyance component.
Figure 5:
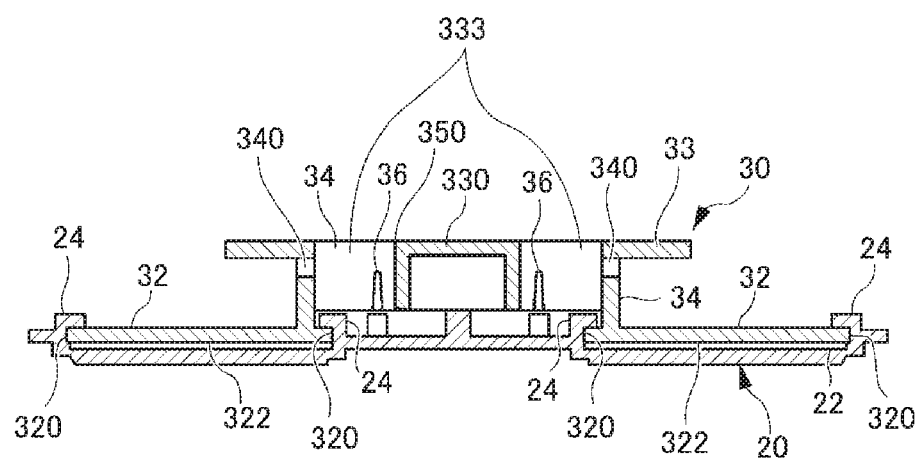
FIG. 5 is a partial cross-sectional view taken along the line A-A in FIG. 2.

The conveyance component will be described. FIG. 3 is a plan view showing a state in which a conveyance component is separated from a container body, and FIG. 4 is a perspective view of the back side of the conveyance component. FIG. 5 is a partial cross-sectional view taken along the line A-A in FIG. 2.

The conveyance component 30 shown in FIG. 4 is able to be attached and detached to a substantially central portion of the ceiling surface 22 of the container body 20. The conveyance component 30, which may also be called a robot flange, is conveyed while in a state of being attached to the container body 20, for example, while being gripped by an overhead conveying device. From the perspective of reliably supporting the substrate storage container 1 containing the substrate W, the conveyance component 30 is molded with the same molding material as the lid 10 and the container body 20.

The conveyance component 30 includes a component body 31 having a substantially hollow frame shape in plan view. A pair of left and right clamped plates 32 extend horizontally on either side of the lower end (the ceiling surface 22 side) of the component body 31. Meanwhile, a flange 33, to be gripped by an overhead traveling device, is integrally formed at the open upper end portion of the component body 31.

Each of the clamped plates 32 is formed into a planar shape and is able to overlap with the ceiling surface of the container body 20, and both side surfaces 320 thereof are inclined so as to be closer to the front side F. From the plan view, elongated circulation openings 321 are drilled into each of the clamped plates 32. Even if the conveyance component 30 is washed while it is mounted on the container body 20, due to these elongated circulation openings 321, water for washing and air for drying is able to be circulated, and no water from the washing remains which enables drying in a short time.

Furthermore, the clamped plates 32 have a plurality of uneven portions 322 at the front end of the back side as well as on both of the side ends. The plurality of uneven portions 322 can be formed not only on the back side of the clamped plate 32 but may also be formed, as need, on the back side of the vertical wall 34 of the component body 31 or the like. These plurality of uneven portions 322 form a plurality of gaps with the ceiling surface 22 of the container body 20. Due to these gaps, like with the elongated circulation openings 321, even if the conveyance component 30 is washed while it is mounted on the container body 20, because the water for washing and the air for drying is able to be circulated, no washing water remains which enables drying in a short time.

The flange 33 is formed in a flat rectangular shape with the four corners chamfered and with a recessed portion 330 formed in the center portion; the flange is sensed and positioned by the overhead traveling device. The recessed portion 330 is formed in a substantially truncated cone shape and is integrated near the bent portion of a plurality of reinforcement ribs 35.

The flange 33 has a circulation opening 332, four corner holes 333, and a circulation opening 334 which communicate with the inside of the component body 31. Specifically, the circulation openings 332 is formed in the center of the front F, and the circulation openings 334 is formed in the center of the back B. In addition, the four corner holes 333 are formed so as to surround the recessed portion 330.

Of the four corner holes 333, on the right and left corner holes 333 located at the front F of the container body 20, first engaging portions 36 are exposed so as to be able to be visible and operable (See FIGS. 3 and 5). Further, a second engaging portion 37 is exposed from the circulation openings 334 so as to be visible and operable (see FIG. 3).

In addition, the component body 31 is provided with vertical walls 34 on the front, back, left and right, and a plurality of reinforcement ribs 35 are integrated with the flange 33 to ensure that strength is provided at the front, back, left and right in the interior. Among the plurality of reinforcing ribs 35, the pair of right and left reinforcement ribs 35 positioned at the front F of the container body 20 are integrally formed with the first engaging portions 36 which extend toward the front F and are elastically deformable. In addition, a plurality of circulation openings 340 are formed in the vertical walls 34, and water for cleaning water, air for drying, and the like is able to be circulated inside and outside the component body 31.

The reinforcement ribs 35 are formed in an L shape in a plan view integrally bridging the inner faces of the vertical walls 34 so as to straddle the corners of the vertical walls 34 of the component body 31, and define a substantially rectangular space in the plan view with the vertical walls 34 of the component body 31, and communicates with the corner holes 333. The reinforcement ribs 35 are formed to be lower than the vertical walls 34 of the component body 31, and gaps (not shown) for circulating water for cleaning and air for drying are formed. Water for cleaning and air for drying circulate inside and outside the component body 31 via this gap and the circulation openings 340 of the vertical walls 34.

The first engaging portions s 36 are formed in a substantially linear plate shape which has flexibility and faces the side reinforcement ribs 35 with a gap therebetween, and a cylindrical lock pin 360 is integrally formed at the lower end of the tip. At the ends of the first engaging portions 36, operation gripping pieces 361 bulging upward are integrally formed in a substantially semicircular shape (see FIG. 6).

Since the first engaging portions 36 are deflected and displaced in the lateral direction of the conveyance component 30, that is, in the Z axis direction of the container body 20, the deflection of the first engaging portions 36 is adjusted to the extent that it does not hit the inner surface 350 of the corner holes 333.

The second engaging portion 37 is formed so as to extend into the circulation opening 334 from the recessed portion 330 toward the back B. The second engaging portion is substantially plate-shaped, and the second engaging portion 37 is formed toward the back B and toward the ceiling surface 22 while the tip of the second engaged portion 37 is bent toward the back B so as to be parallel to the ceiling surface 22 (see FIG. 7).

Here, the second engaging portion 37 may be formed so that the tip of the second engaging portion 37 contacts the ceiling surface 22, or a slight gap may be formed. The front F side of the bent portion is rounded.

Figure 6:
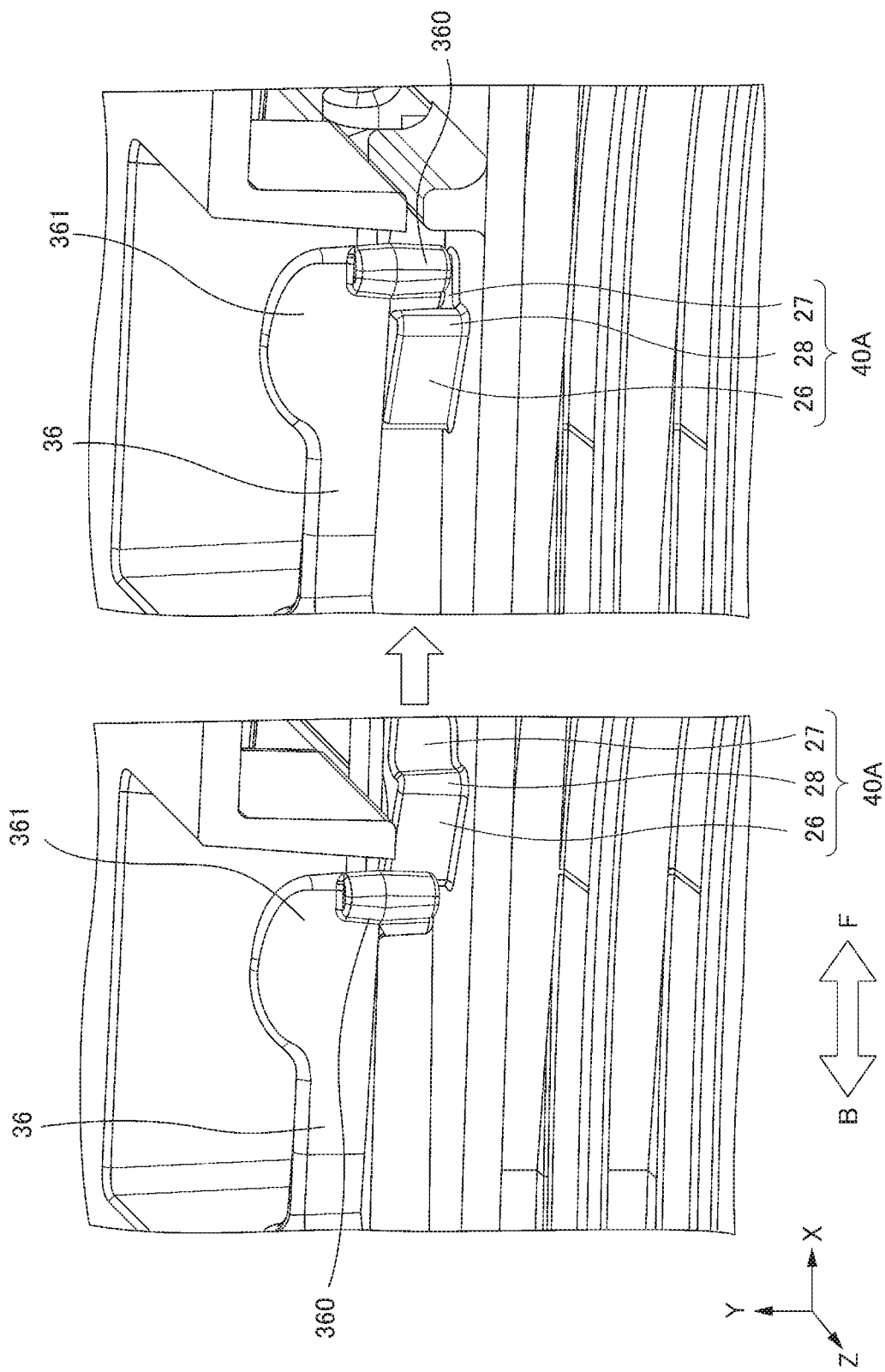
FIG. 6 is a partial cross-sectional perspective view showing a first mounting portion.
Figure 7:
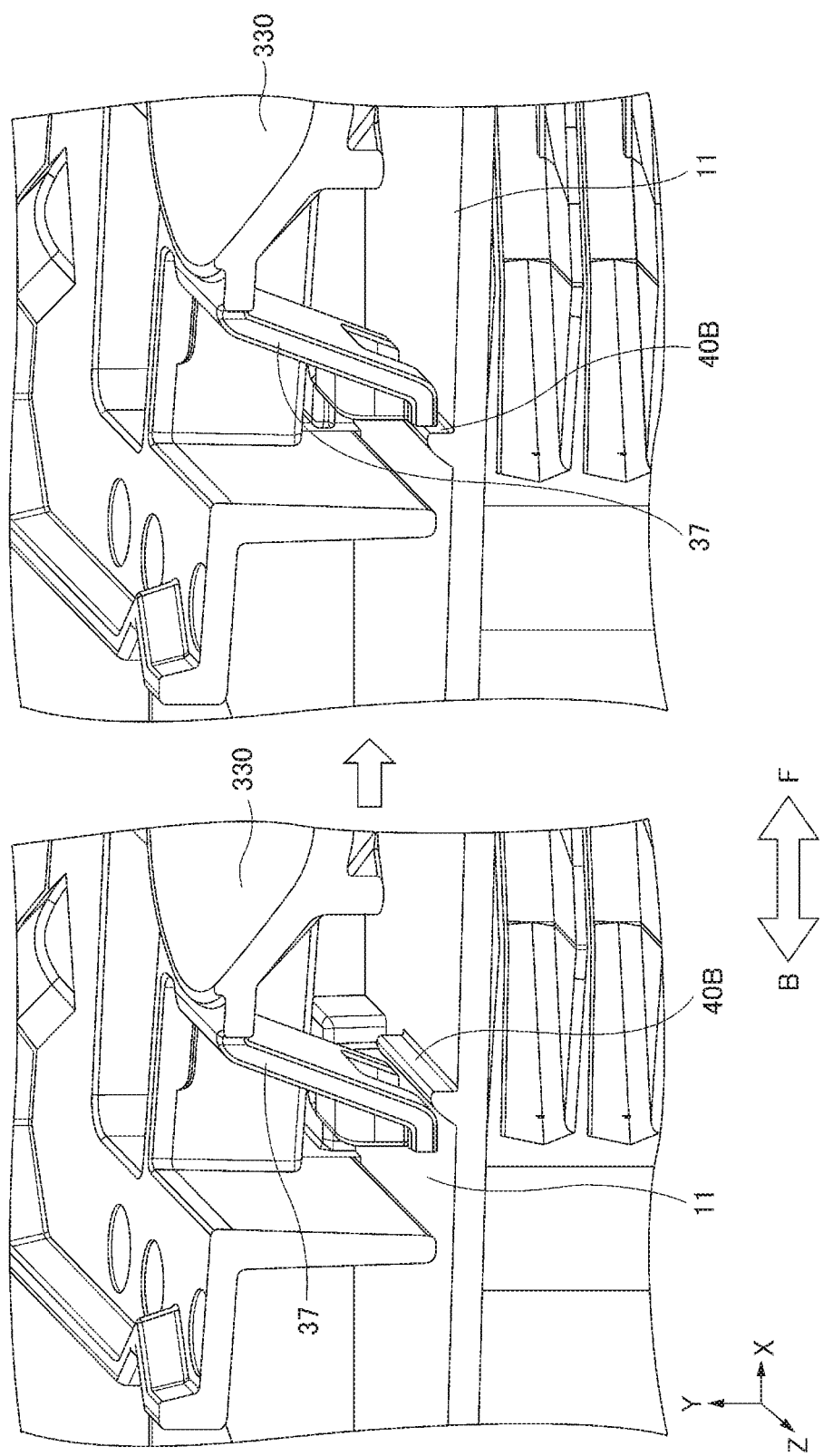
FIG. 7 is a partial cross-sectional perspective view showing a second mounting portion.

Next, the mounting mechanism will be described. FIG. 6 is a partial cross-sectional perspective view showing a first mounting portion, and FIG. 7 is a partial cross-sectional perspective view showing a second mounting portion. The mounting mechanism 40 for attaching the conveyance component 30 is integrally formed on the ceiling surface 22 of the container body 20. Therefore, the mounting mechanism 40 is formed of the same molding material as the container body 20.

The mounting mechanism 40 includes first mounting portions 40A and a second mounting portion 40B (see FIGS. 6 and 7). The first mounting portions 40A are provided on the side of the opening 21 toward the front F of the container body 20 and the second mounting portion 40B is provided towards the back B away from the opening 21.

The mounting mechanism 40 includes a pair of right and left support rails 24 facing each other on either side of the surface of the ceiling surface 22 of the container body 20 (see FIG. 3). More specifically, the pairs of support rails 24 are arranged with the center of the ceiling surface 22 of the container body 20 in between. The above-described conveyance component 30 is able to be detachably supported between the pair of support rails 24.

The pair of support rails 24 are inclined so that the width between one support rail 24 and the other support rail 24 gradually narrows from the back B to the front F of the container body 20. Further, the support rails 24 are bent with a substantially L-shaped cross section rising from the ceiling surface 22 (see FIG. 5) so as to form a groove with the ceiling surface 22, and linearly extend in the front-back direction of the container body 20.

At the front F between the pairs of support rails 24, stoppers 25 having substantially L-shaped cross sections similar to the support rails 24 are formed on the ceiling surface 22 of the container body 20 (see FIG. 3). The stoppers 25 restrict, fit, and lock the movement of the conveyance component 30 toward the front F.

A pair of right and left first mounting portions 40A are provided on the ceiling surface 22 of the container body 20 located between the stoppers 25. The first mounting portions 40A include guide pieces 26 extending toward the front F of the container body 20, and interference engagement portions 27 are integrally formed on the front portions of the outer side surfaces of the guide pieces 26.

The front end of the guide pieces 26 and the interference engagement portions 27 are combined into a bifurcated portion 28 with a slightly deformed Y shape in the planar view, and each guide piece 26 is inclined inward in the Z axis direction. The interference engagement portions 27 extend toward the front F of the container body more than the guide pieces 26, and the tip forms the bifurcated portions 28. The bifurcated portions 28 are not particularly limited, but from the perspective of preventing the conveyance component 30 from easily coming out in the insertion direction after being locked, it is preferable to be inclined in the insertion direction or to be recessed.

The second mounting portion 40B is provided at a position as a protrusion extending in the left-right direction towards the back B between the pair of first mounting portions 40A. The shape of the second mounting portion 40B is a mountain shape having an inclined surface toward the back B, the cross sectional shape is a substantially right triangle, and the top portion thereof is rounded (see FIG. 7).

A method of attaching the conveyance component to the mounting mechanism will be described. In order to mount the conveyance component 30 on the mounting mechanism 40 of the container body 20, the conveyance component 30 is disposed on the back side B of the ceiling surface 22 of the container body 20; each of the clamping plates 32 of the conveyance component 30 is clamped between the plurality of pairs of support rails 24 of the mounting mechanism 40, slid toward the front F of the container body 20, and the front portion of each of the clamped plates 32 of the conveyance component 30 is fitted and locked to each stopper 25 thereby preventing the conveyance component 30 from coming off upward (see FIG. 3).

At this time, since the pairs of support rails 24 of the mounting mechanism 40 are inclined in the front-back direction of the container body 20, it is possible to prevent positional displacement and rattling of the conveyance component 30 with respect to the container body 20 with a simple configuration. Therefore, it is possible to appropriately slide the conveyance component 30 to a predetermined position. Also, since the side surfaces 320 of the clamped plates 32 of the conveyance component 30 are also inclined corresponding to the inclination of the support rail 24, there is no mistake in the orientation when setting the conveyance component 30.

Further, as shown in FIG. 6, when the conveyance component 30 slides toward the front F, the lock pins 360 of the first engaging portions 36 of the conveyance component are guided while being in contact with the pair of inclined guide pieces 26 of the first mounting portions 40A of the mounting mechanism 40, and after the pair of first engaging portions 36 are deflected and displaced respectively in the left and right direction, specifically inwardly in the Z axis direction of the container body 20, each lock pin 360 climbs over the front portion of the guide piece 26 and engages with the branched bifurcated portion 28 of each guide piece 26 and interference engagement portion 27.

Also, as shown in FIG. 7, when a lock pin 360 climbs over the front portion of the guide piece 26 and engages the branched bifurcated portion 28 of the guide piece 26 and the interference engagement portion 27, almost simultaneously the second engaging portion 37 is engaged with the second mounting portion 40B of the mounting mechanism 40. That is, when the conveyance component 30 slides to the front F, the second engaging portion 37 bends in the Y axis direction and is displaced to get over the inclined portion of the second mounting portion 40B and engages.

Conversely, in order to remove the conveyance component 30 from the mounting mechanism 40 of the container body 20, two operations must be performed on the first mounting portions 40A and the second mounting portion 40B.

First, with regard to the first mounting portions 40A, a finger is inserted into corner holes 333 of the conveyance component 30 from above and the grip piece 361 of each of the first engaging portions 36 is pushed from the left and right in the direction toward the inner surface 350 of the corner holes 333; the first engaging portions 36 are deflected inward in the left-right direction of the container body 20 and displaced, and the engagement between the interference engagement portions 27 and the lock pins 360 is released.

Next, with respect to the second mounting portion 40B, the second engaging portion 37 is lifted and displaced in the Y-axis direction to release the engagement with the second mounting portion 40B. Therefore, with respect to the first mounting portions 40A and the second mounting portion 40B, by performing two operations and sliding the conveyance component 30 toward the back B with respect to the mounting mechanism 40, the conveyance component 30 can be removed from the mounting mechanism 40.

As described above and in accordance with the embodiments of the present invention, the substrate storage container 1 has an opening 21 closed by the lid 10; the container body 20 is capable of storing a plurality of substrates W and a conveyance component 30 is detachably attached to a mounting mechanism 40 provided on the container body 20; and the mounting mechanism 40 includes first mounting portions 40 A towards the opening 21 (front F) side of the container body 20 and a second mounting portion 40 B on the side away from the opening portion 21 (back B).

In this way, because the conveyance component 30 is engaged with the container body 20 at the two locations of the first mounting portions 40A and the second mounting portion 40B, increasing the mounting force for the container body 20 is possible. When comparing the conventional substrate storage container disclosed in Patent Document 1 having no second mounting portion 40B with the substrate storage container 1 of the present embodiment, a force of 550 N or more was necessary for the substrate storage container 1 of the present embodiment when compared to conventional substrate storage containers when determining whether or not the conveyance component 30 is able to be detached from the container body 20 by pushing the conveyance component 30 mounted on the container body 20 toward the back B.

In addition, since the conveyance component 30 slides from the back B toward the front F of the container body 20 and is detachably engaged with the support rails 24 and is fitted and engaged with the stoppers 25, excessive sliding is controlled.

Furthermore, since the top of the second mounting portion 40B is rounded and the front F of the bent portion of the tip of the second engaging portion 37 is also rounded, when the second engaging portion 37 bends in the Y axis direction and gets over the inclined portion of the second mounting portion 40B and engages, the second engaging portion 37 can be engaged with a smooth motion without catching.

In the embodiment, operations are performed on the first mounting portions 40A and the second mounting portion 40B, respectively, so as to remove the conveyance component 30. Thereby, there is a large mounting force between the conveyance component 30 and the container body 20, and the conveyance component 30 does not easily become detached by one action.

In the above-described embodiment, the number of the first mounting portions 40A is two and the number of the second mounting portions 40B is one, but the present invention is not limited thereto. For example, one or three or more first mounting portions 40A may be provided, or two or more second mounting portions 40B may be provided. In this case, the first engaging portions 36 and the second engaging portion 37 will be formed based on the first mounting portion(s) 40A and the second mounting portion (s) 40B, respectively.

In the above embodiment, the first engaging portions 36 that engage with the first mounting portions 40A are displaced in the left-right direction, which is the X-axis direction, and the second engaging portion 37 engaged with the second mounting portion 40B is displaced in the upward direction, which is the Y axis direction; however, if the direction of displacement of the first engaging portions is different from the direction of displacement of the second engaging portion 37, the direction of displacement is not limited to these directions.

In the above embodiment, the conveyance component is engaged with the first mounting portions 40A and the second mounting portion 40B of the mounting mechanism 40 at substantially the same time; however, in order to distribute the force (sliding force) when attaching the conveyance component 30 on the container body 20, the positions at which the first mounting portions 40A and the first engaging portions 36 and the second mounting portion 40B and the second engaging portion 37 are formed may be shifted, and the engaging timing may be shifted.

In the above embodiment, the mounting mechanism 40 is provided on the ceiling surface 22 of the container body 20, and the robotic flange is mounted as the conveyance component 30; however, the mounting mechanism 40 may be provided on the outer surface of the left and right side walls 23 which are the peripheral walls of the container body 20 and manual handles may be mounted as the conveyance component 30. The ceiling surface 22 or the outer surface of the left and right side walls 23 may be referred to as a first surface.

Further, when removing the conveyance component 30 attached to the mounting mechanism 40 of the container body 20, a special jig may be manufactured and the conveyance component may be removed using the special jig.

Although the preferred embodiments of the present invention have been described in detail above, the present invention is not limited to the above-described embodiments, and various modifications and changes are possible within the scope of the gist of the present invention described in the claims.

The invention claimed is:

1. A substrate storage container comprising:
   a container body having an opening closed by a lid and capable of storing a plurality of substrates, and
   a conveyance component detachably attached to a mounting mechanism provided on the container body,
   wherein the mounting mechanism includes at least one first mounting portion towards the opening side of the container body and at least one second mounting portion towards the side away from the opening on a first surface of the container body extending away from the opening,
   wherein the conveyance component has engaging portions to be engaged with the mounting mechanism, and the engaging portions include at least one first engaging portion that is elastically displaced in a predetermined direction and engages with the at least one first mounting portion and at least one second engaging portion that is elastically displaced in a direction different from the predetermined direction to engage with the at least one second mounting portion,
   wherein the at least one first mounting portion includes at least one pair of first mounting portions disposed substantially parallel to the opening of the container body on the first surface,
   wherein in the at least one pair of first mounting portions, each first mounting portion has a guide piece which extends toward the opening side of the container body, and an interference engagement portion which connects with an end portion of the guide piece on the opening side of the container body,
   wherein the at least one pair of the interference engagement portions at least partly extend substantially parallel to each other toward the opening of the container body.

2. The substrate storage container according to claim 1, wherein the mounting mechanism is provided on a peripheral wall of the container body and includes at least one stopper for engaging and locking the conveyance component.

3. The substrate storage container according to claim 1, wherein the at least one first portion is configured to be able to be elastically displaced to engage with the at least one first mounting engaging portion in a condition that the at least one second engaging portion engages with the at least one second mounting portion.

4. The substrate storage container according to claim 1, wherein the at least one first mounting portion is configured so as to be able to engage with the at least one first engaging portion at substantially the same time when the at least one second engaging portion engages with the at least one second mounting portion.

5. The substrate storage container according to claim 3, wherein the at least one first engaging portion is configured to extend towards the opening side of the container body and is able to be elastically displaced substantially parallel to the first surface when the at least one first engaging portion engages with the at least one first mounting portion, and
wherein the at least one second engaging portion is configured to extend towards the side away from the opening of the container body and is able to be elastically displaced substantially perpendicular to the first surface when the at least one second engaging portion engages with the at least one second mounting portion.

6. The substrate storage container according to claim 1, wherein in the at least one pair of first mounting portions, a distance between the at least one pair of the guide pieces becomes smaller as the at least one pair of the guide pieces approach the opening of the container body in a direction substantially parallel to the opening of the container body.

7. The substrate storage container according to claim 1, wherein the at least one second mounting portion is disposed at the same distance from the at least one pair of the first engaging portions.

8. The substrate storage container according to claim 1, wherein the first surface is a ceiling surface.

9. A substrate storage container comprising:
a container body having an opening closed by a lid and capable of storing a plurality of substrates, and
a conveyance component detachably attached to a mounting mechanism provided on the container body,
wherein the mounting mechanism includes at least one first mounting portion towards the opening side of the container body and at least one second mounting portion towards the side away from the opening on a first surface of the container body extending away from the opening,
wherein the conveyance component has engaging portions to be engaged with the mounting mechanism, and the engaging portions include at least one first engaging portion that is elastically displaced in a predetermined direction and engages with the at least one first mounting portion and at least one second engaging portion that is elastically displaced in a direction different from the predetermined direction to engage with the at least one second mounting portion,
wherein the at least one first mounting portion is configured to be able to be elastically displaced to engage with the at least one first engaging portion in a condition that the at least one second engaging portion engages with the at least one second mounting portion,
wherein the at least one first engaging portion is configured to extend towards the opening side of the container body and is able to be elastically displaced substantially parallel to the first surface when the at least one first engaging portion engages with the at least one first mounting portion,
wherein the at least one second engaging portion is configured to extend towards the side away from the opening of the container body and is able to be elastically displaced substantially perpendicular to the first surface when the at least one second engaging portion engages with the at least one second mounting portion, and
wherein the at least one second mounting portion is a protrusion having an inclined surface on an opposite side to the opening of the container body.

10. The substrate storage container according to claim 9, wherein the at least one second engaging portion has a plate-like shape,
wherein the at least one second engaging portion has an inclined part which approaches the first surface as the inclined part is more away from the opening of the container body when the at least one second engaging portion engages with the at least one second mounting portion, and has a tip which engages with the protrusion of the at least one second mounting portion.

11. The substrate storage container according to claim 10, wherein the tip of the at least one second engaging portion extends substantially parallel to the first surface when the at least one second engaging portion engages with the at least one second mounting portion,
wherein a space is formed so as to pass through the inclined part on a tip-side of the inclined part.

12. A substrate storage container comprising:
a container body having an opening closed by a lid and capable of storing a plurality of substrates, and
a conveyance component detachably attached to a mounting mechanism provided on the container body,
wherein the mounting mechanism includes at least one first mounting portion towards the opening side of the container body and at least one second mounting portion towards the side away from the opening on a first surface of the container body extending away from the opening,
wherein the conveyance component has engaging portions to be engaged with the mounting mechanism, and the engaging portions include at least one first engaging portion that is elastically displaced in a predetermined direction and engages with the at least one first mounting portion and at least one second engaging portion that is elastically displaced in a direction different from the predetermined direction to engage with the at least one second mounting portion,
wherein the first surface has at least one pair of support rails,
wherein the conveyance component is able to be guided by the at least one pair of support rails to move in a front-back direction with respect to the opening of the container body.

13. The substrate storage container according to claim 12, wherein the conveyance component is supported on the opposite sides by the at least one pair of support rails, and
wherein a distance between each of the at least one pair of support rails becomes smaller as the at least one pair of support rails approaches the opening of the container body in a direction substantially parallel to the opening of the container body.

14. The substrate storage container according to claim 13, wherein at least one of the at least one first mounting portion and the at least one second mounting portion is partly disposed between the at least one pair of supporting rails in the direction substantially parallel to the opening of the container body.

\* \* \* \* \*

UNITED STATES PATENT AND TRADEMARK OFFICE
CERTIFICATE OF CORRECTION

PATENT NO. : 10,727,099 B2  
APPLICATION NO. : 16/324712  
DATED : July 28, 2020  
INVENTOR(S) : Hiroshi Nimura et al.

Page 1 of 1

It is certified that error appears in the above-identified patent and that said Letters Patent is hereby corrected as shown below:

In the Claims

Column 9, Line 5, Claim 3, after "first" insert -- mounting --

Column 9, Line 7, Claim 3, before "engaging" delete "mounting"

Signed and Sealed this  
Fifteenth Day of December, 2020

Andrei Iancu  
*Director of the United States Patent and Trademark Office*